United States Patent
Magee et al.

(10) Patent No.: US 10,695,805 B2
(45) Date of Patent: Jun. 30, 2020

(54) CONTROL SYSTEM FOR A SENSOR ASSEMBLY

(71) Applicant: TEXAS INSTRUMENTS INCORPORATED, Dallas, TX (US)

(72) Inventors: David Patrick Magee, Allen, TX (US); Stephen John Fedigan, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 221 days.

(21) Appl. No.: 15/605,463

(22) Filed: May 25, 2017

(65) Prior Publication Data

US 2018/0221921 A1    Aug. 9, 2018

Related U.S. Application Data (60) Provisional application No. 62/454,154, filed on Feb. 3, 2017.

(51) Int. Cl.
*H01L 41/09* (2006.01)
*B08B 7/02* (2006.01)
(Continued)

(52) U.S. Cl.
CPC ............... *B08B 7/028* (2013.01); *B60S 1/56* (2013.01); *G01K 13/00* (2013.01); *G01N 29/022* (2013.01);
(Continued)

(58) Field of Classification Search
CPC ........... B06B 7/028; B60S 1/56; G01K 13/00; G01N 29/022; G01N 29/036;
(Continued)

(56) References Cited

U.S. PATENT DOCUMENTS 3,681,626 A    8/1972 Puskas
4,019,073 A    4/1977 Vishnevsky et al.
(Continued)

FOREIGN PATENT DOCUMENTS

EP    1703062        9/2006
EP    2479595 A1    7/2012
(Continued)

OTHER PUBLICATIONS

International Search Report for PCT Application No. PCT/US2018/016714, dated Jun. 21, 2018 (2 pages).
(Continued)

*Primary Examiner* — Thomas M Dougherty
(74) *Attorney, Agent, or Firm* — Michael A. Davis, Jr.; Charles A. Brill; Frank D. Cimino (57) ABSTRACT

A control system for cleaning and monitoring a sensor assembly disposed externally on a vehicle is provided and includes a contaminant detection/identification sub-system that measures a resonant frequency of the sensor assembly to detect contaminants disposed on an exposed surface of the sensor assembly. A cleaning sub-system is provided and includes cleaning modes that expel the contaminants from the exposed surface of the sensor assembly. A temperature monitoring device monitors a temperature of an actuator disposed in the sensor assembly and a fault detection device detects faults in the sensor assembly.

16 Claims, 9 Drawing Sheets

(51) Int. Cl.
*G01N 29/036* (2006.01)
*H01L 41/04* (2006.01)
*G01N 29/02* (2006.01)
*B60S 1/56* (2006.01)
*G01K 13/00* (2006.01)
*G01N 29/34* (2006.01)
*G01R 31/34* (2020.01)

(52) U.S. Cl.
CPC ......... *G01N 29/036* (2013.01); *G01N 29/348* (2013.01); *G01R 31/34* (2013.01); *H01L 41/042* (2013.01); *H01L 41/09* (2013.01); *G01N 2291/0256* (2013.01)

(58) Field of Classification Search
CPC ......... G01N 29/348; G01N 2291/0256; G01R 31/34; H01L 41/09
USPC ......................................... 310/316–319, 338
See application file for complete search history.

(56) References Cited

U.S. PATENT DOCUMENTS

| | | | |
|---|---|---|---|
| 4,271,371 A | 6/1981 | Furuichi et al. | |
| 4,556,467 A | 12/1985 | Kuhn et al. | |
| 4,607,652 A | 8/1986 | Yung | |
| 4,691,725 A | 9/1987 | Parisi | |
| 4,710,233 A | 12/1987 | Hohmann et al. | |
| 4,836,684 A | 6/1989 | Javorik et al. | |
| 4,852,592 A | 8/1989 | DeGangi et al. | |
| 4,870,982 A | 10/1989 | Liu | |
| 5,005,015 A | 4/1991 | Dehn et al. | |
| 5,071,776 A | 12/1991 | Matsushita et al. | |
| 5,113,116 A | 5/1992 | Wilson | |
| 5,178,173 A | 1/1993 | Erickson et al. | |
| 5,853,500 A * | 12/1998 | Joshi | C23C 18/1216 148/247 |
| 6,064,259 A | 5/2000 | Takita | |
| 6,607,606 B2 | 8/2003 | Bronson | |
| 7,705,517 B1 | 4/2010 | Koen et al. | |
| 8,286,801 B2 | 10/2012 | Youngs | |
| 8,293,026 B1 | 10/2012 | Bodor et al. | |
| 8,494,200 B2 | 7/2013 | Ram | |
| 8,899,761 B2 | 12/2014 | Tonar et al. | |
| 9,070,856 B1 | 6/2015 | Rose et al. | |
| 9,080,961 B2 | 7/2015 | Adachi | |
| 9,084,053 B2 | 7/2015 | Parkins | |
| 9,095,882 B2 | 8/2015 | Shimada et al. | |
| 9,226,076 B2 | 12/2015 | Lippert et al. | |
| 9,253,297 B2 | 2/2016 | Abe et al. | |
| 9,573,165 B2 | 2/2017 | Weber | |
| 2006/0285108 A1 | 12/2006 | Morrisroe | |
| 2007/0046143 A1 | 3/2007 | Blandino | |
| 2007/0159422 A1 | 7/2007 | Blandino | |
| 2008/0198458 A1 | 8/2008 | Kashiyama | |
| 2008/0248416 A1 | 10/2008 | Norikane | |
| 2010/0171872 A1 | 7/2010 | Okano | |
| 2011/0073142 A1 | 3/2011 | Hattori et al. | |
| 2013/0170685 A1 | 7/2013 | Oh | |
| 2013/0242481 A1 | 9/2013 | Kim | |
| 2013/0333978 A1 | 12/2013 | Abe | |
| 2014/0033454 A1 | 2/2014 | Koops et al. | |
| 2014/0218877 A1 | 8/2014 | Wei | |
| 2014/0253150 A1 | 9/2014 | Menzel | |
| 2015/0277100 A1 | 10/2015 | Novoselov | |
| 2016/0266379 A1 | 9/2016 | Li et al. | |
| 2017/0361360 A1 | 12/2017 | Li et al. | |
| 2018/0085784 A1 | 3/2018 | Fedigan | |
| 2018/0085793 A1 | 3/2018 | Fedigan | |
| 2018/0117642 A1 | 5/2018 | Magee et al. | |
| 2018/0239218 A1 | 8/2018 | Ikeuchi et al. | |
| 2018/0264526 A1 | 9/2018 | Kim | |
| 2018/0275397 A1 | 9/2018 | Chung et al. | |
| 2018/0304282 A1 | 10/2018 | Cook | |
| 2018/0304318 A1 | 10/2018 | Revier | |
| 2018/0326462 A1 | 11/2018 | Revier | |
| 2019/0277787 A1 | 9/2019 | Chung et al. | |

FOREIGN PATENT DOCUMENTS

| | | |
|---|---|---|
| EP | 2777579 B1 | 4/2015 |
| EP | 2873572 A1 | 5/2015 |
| JP | 2009283069 A | 12/2009 |
| JP | 5608688 A | 10/2014 |
| KR | 20130076250 A | 7/2013 |
| WO | 2007005852 A2 | 1/2007 |
| WO | 2010104867 A1 | 9/2010 |
| WO | 2018207041 | 11/2018 |

OTHER PUBLICATIONS

International Search Report for PCT/US2017/059536 dated Feb. 28, 2018.
Vaseiljev, "Ultrasonic system for solar panel cleaning", Sensors and Actuators A, vol. 200, Oct. 1, 2013, pp. 74-78.
Kazemi, "Substrate cleaning using ultrasonics/megasonics," 2011 IEEE/SEMI Advanced Semiconductor Manufacturing Conference, Saratoga Springs, NY, 2011, pp. 1-6.
Brereton, "Particle Removal by Focused Ultrasound", Journal of Sound and Vibration vol. 173, Issue 5, Jun. 23, 1994, pp. 683-698.
Gale, "Removal of Particulate Contaminants using Ultrasonics and Megasonics: A Review", Particulate Science and Technology, 1994, 13:3-4, 197-211.
Lee, "Smart self-cleaning cover glass for automotive miniature cameras," 2016 IEEE 29th International Conference on Micro Electro Mechanical Systems (MEMS), Shanghai, 2016, pp. 83-86.
International Search Report for PCT/US2017/064530 dated Apr. 5, 2018.
Graff, "Wave Motion in Elastic Solids", Dover, 1991 (3 pages).
Hagedorn et al., "Travelling Wave Ultrasonic Motors, Part I: Working Principle and Mathematical Modelling of the Stator", Journal of Sound and Vibration, 1992, 155(1), pp. 31-46.
Ziaei-Moayyed et al., "Electrical Deflection of Polar Liquid Streams: A Misunderstood Demonstration," Journal of Chemical Education, vol. 77, No. 11, Nov. 2000 (4 pages).
Howard, "High speed photography of ultrasonic atomization," Thesis, Brown University, May 13, 2010 (39 pages).
U.S. Appl. No. 15/492,315, entitled "Methods and Apparatus for Ultrasonic Lens Cleaner Using Configurable Filter Banks," filed Apr. 20, 2017 (63 pages).
U.S. Appl. No. 15/492,286, entitled "Methods and Apparatus Using Multistage Ultrasonic Lens Cleaning for Improved Water Removal," filed Apr. 20, 2017 (62 pages).
U.S. Appl. No. 15/492,433, entitled "Methods and Apparatus for Surface Wetting Control," filed Apr. 20, 2017 (46 pages).
U.S. Appl. No. 15/492,395, entitled "Methods and Apparatus for Electrostatic Control of Expelled Material from Lens Cleaners," filed Apr. 20, 2017 (28 pages).
Extended European Search Report for 17866470.2 dated Oct. 8, 2019.
Extended European Search Report for 17878085.4 dated Nov. 22, 2019.
Partial Supplementary European Search Report for 18747814.4 dated Jan. 30, 2020.

* cited by examiner

CONTROL SYSTEM FOR A SENSOR ASSEMBLY

RELATED APPLICATIONS

This application claims priority of U.S. Provisional Application Ser. No. 62/454,154 filed on Feb. 3, 2017 and entitled SIGNALING AND SENSING FRAMEWORK FOR A LENS COVER SYSTEM, which is incorporated by references herein in its entirety.

TECHNICAL FIELD

This disclosure relates generally to a control system for a sensor assembly.

BACKGROUND

Obstacle and collision avoidance systems can be used to mitigate damage to vehicles and other property due to collisions. Various technologies regarding obstacle and collision avoidance systems can be incorporated into vehicles at a reasonable cost. Some technologies include sensors and digital cameras for sensing and monitoring areas around the vehicle. In some cases, cameras can increase safety by being mounted in locations that can give drivers access to alternative perspectives, which are otherwise diminished or unavailable to the driver's usual view through windows or mirrors.

SUMMARY

One example includes a control system for a sensor that includes a contaminant detection sub-system that measures a resonant frequency of the sensor assembly, the sensor assembly including a housing, an actuator and a sensor both disposed in the housing, and a housing cover that enables sensing by the sensor therethrough, the contaminant detection sub-system detects contaminants on an exposed surface of the housing cover and provides a detection signal identifying contaminants on the housing cover based on the resonant frequency of the sensor assembly, and a cleaning sub-system that provides a cleaning control signal to the actuator to expel the contaminants from the housing cover in response to the detection signal.

Another example includes a contaminant sensing system that includes a sensor assembly disposed on an exterior of a vehicle, the sensor assembly including an actuator and a sensor both disposed in a housing that enables sensing by the sensor through the housing, a contaminant detection sub-system that measures a resonant frequency of the sensor assembly, the contaminant detection sub-system to provide a detection signal in response to detecting contaminants on an exposed surface of the housing, a cleaning sub-system that implements expelling the contaminants from the exposed surface in response to the detection signal, and a temperature regulating device that regulates power to the actuator based on a temperature of the actuator.

Another example includes a method of expelling contaminants from a sensor that includes measuring a change in a resonant frequency of a sensor assembly to detect contaminants on an exposed surface of the sensor assembly, measuring a change in the frequency response of the sensor assembly to determine the presence and amount of contaminants on the exposed surface, determining a cleaning mode based on the amount of contaminants on the exposed surface, determining a cleaning phase based on the amount of contaminants on the exposed surface, and generating a cleaning control signal to an actuator of the sensor assembly to expel the contaminants from the exposed surface.

DETAILED DESCRIPTION

This disclosure relates generally to a sensing and signaling control/monitoring system for sensors (sensor assembly) disposed externally on a vehicle. More specifically, the disclosure relates to a sensing and signaling control/monitoring system for identifying contaminants, cleaning, temperature detection/regulation, fault detection, power regulation, etc. relating to sensors disposed externally on the vehicle. Ultrasound excitation for cleaning sensors provides a more cost effective and efficient approach than water sprayers, mechanical wipers, or air jet solutions. Thus, the sensing and signaling control/monitoring system utilizes an actuator that vibrates the sensor assembly and consequently, drives a contaminant (e.g., water, mist, ice, dirt, mud, etc.) deposited on an exposed surface of a sensor assembly at its resonant frequency so as to facilitate the removal of the contaminant from the exposed surface. More specifically, when the actuator is excited by the proper periodic waveform, the actuator will vibrate the sensor assembly. Properly adjusting the frequency and amplitude of the vibration will expel the contaminant from the exposed surface. Since different contaminant amounts and types result in different resonant frequencies, the actuator can provide a frequency in a range of frequencies that encompass the resonant frequencies of the combined sensor assembly and the amount of contaminant deposited on the exposed surface. Some example actuators include a piezoelectric transducer, a voice coil actuator, etc.

The sensing and signaling control/monitoring system can be utilized with any sensor device disposed externally on the vehicle. For example, some sensor devices include camera systems (e.g., camera monitoring systems (CMS), surround view systems (SVS)), photodetectors, external mirrors, reflectors, lasers (LiDAR). Other types of sensor devices may include short- and long-range radar, near-field transceiver, acoustic sensors or the like. Accordingly, the housing for the lens of cameras or other devices can include an exposed lens cover surface (e.g., camera, reflector, sensor, etc.). Similarly, other types of sensors (different from optical sensors or cameras) also include an external housing to protect the sensing devices from the environment. Each housing has an associated surface through which the signaling and/or sensing are provided to implement the corresponding sensing function (imaging, radar, LiDAR, near-field sensing, etc.). The sensing and signaling control/monitoring system not only cleans the housing, as mentioned above, but also includes components to monitor other environmental or operating parameters for the sensor assembly. Examples of the environmental and operating parameters include temperature detection, fault detection (e.g., monitor the integrity and functionality of the exposed surface), power regulation, etc. The sensing and signaling control/monitoring system thus can extend the mechanical life of the sensor assembly and maintain its surface substantially free of contaminants. The sensing and signaling control/monitoring system may also provide early warnings for potential failures for the sensor assembly.

Figure 1:
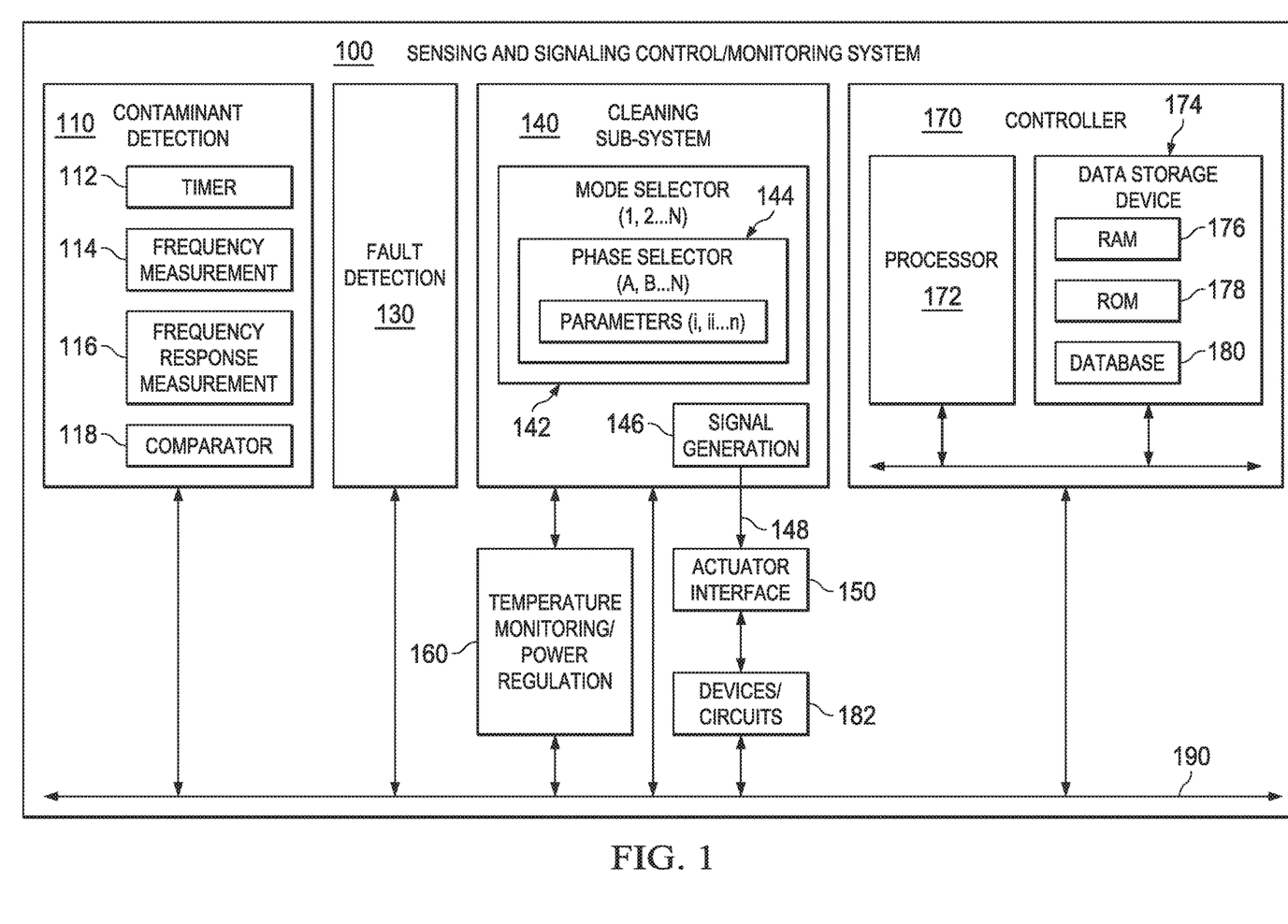
FIG. 1 illustrates an example sensing and signaling control/monitoring system for a sensor assembly.
Figure 2:
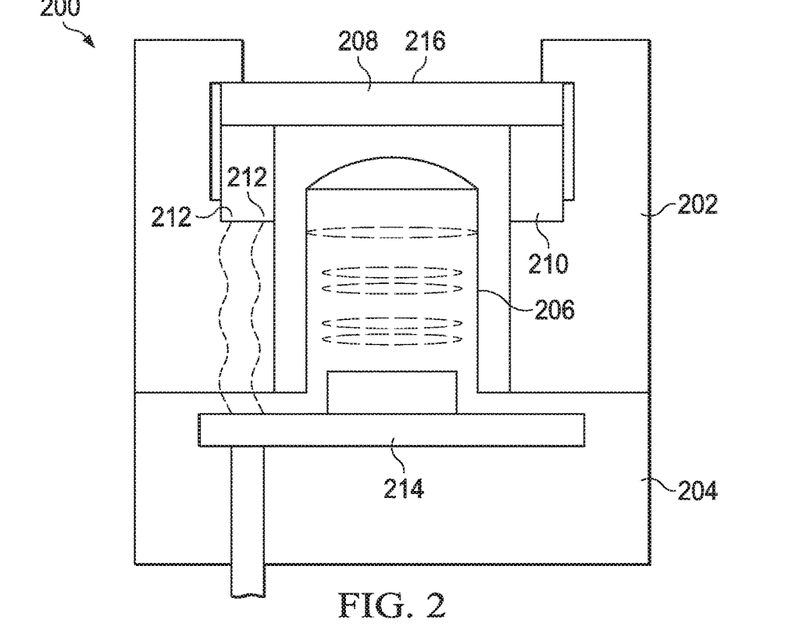
FIG. 2 illustrates an example for use on an exterior of a vehicle.

Referring to FIGS. 1 and 2, FIG. 1 illustrates an example sensing and signaling control/monitoring system 100 and FIG. 2 is an example sensor assembly 200 that can be used with the sensing and signaling control/monitoring system 100. The sensing and signaling control/monitoring system 100 includes a contaminant detection sub-system 110 that measures a resonant frequency of a sensor assembly, a fault detection sub-system 130 that detects faults in the sensor assembly based on the change in the frequency of the sensor assembly, a cleaning sub-system 140 that provides a cleaning control signal to an actuator in the sensor assembly to expel contaminants from exposed surfaces of the sensor assembly, and a temperature monitoring/power regulation device 160 that monitors a temperature of the actuator. A controller 170 is provided to control the sub-systems and devices via a bus 190.

The example sensor assembly 200 illustrated in FIG. 2 is an example camera lens assembly for use on a camera. The sensor assembly 200 includes a housing 202 attached to a camera body 204, a sensing device (e.g., camera lens) 206 disposed in the housing 202, a transparent housing cover 208 disposed at an open end of the housing 202, and an actuator 210. The actuator 210 is disposed in the housing 202 and is attached to the housing cover 208. The actuator 210 includes electrodes 212 that allow the actuator 210 to be connected to the controller 170 via a circuit interface 214. In the example camera lens assembly, the actuator 210 can be a transducer (e.g., piezoelectric cylindrical or ring type transducer) that when excited by proper signaling, will vibrate the housing cover 208. As described herein, by correctly adjusting the frequency and/or the amplitude of the vibration the contaminants can be expelled from an exposed surface 216 of the housing cover 208.

Referring to FIG. 1 and FIGS. 3-5, the contaminant detection sub-system 110 detects and identifies contaminants disposed on an exposed surface of a sensor assembly (e.g., an exposed surface of a housing/lens cover) and can include a timer 112, a frequency measurement circuit 114, a frequency response measuring circuit 116, and a comparator 118. In one example, the contaminant detection sub-system 110 can be configured via the timer 112 to periodically check for contaminants based on various factors such as an amount of time the vehicle is in motion, a speed of the vehicle, direction of the vehicle (e.g., forward, reverse, turning), etc. The wait period can be dynamically updated (i.e. increased, decreased, no change) during the detection process. In another example, the contaminant detection sub-system 110 can be triggered manually (e.g., switch, push button, etc.) by an occupant of the vehicle. In yet another example, the contaminant detection sub-system 110 can be triggered by the sensor assembly if the sensor assembly senses that contaminants may be on the exposed surface. Thus, the triggering of the contaminant detection sub-system 110 can come from one of multiple sources.

Still referring to FIG. 1, the frequency measurement circuit 114 monitors a change in a resonant frequency of the sensor assembly to detect the presence of contaminants disposed on the exposed surface of the sensor assembly. A shift in the resonant frequency indicates that contaminants are present on the exposed surface of the sensor assembly. Specifically, the sensor assembly has a resonant frequency referred to as a natural frequency $\omega_n$ and is defined by Equation (1):

$$\omega_n = \sqrt{\frac{k}{m}} \tag{1}$$

where k is the effective stiffness of a mechanical system (sensor assembly) expressed in N/m and m is the effective mass of the mechanical system expressed in kg. When contaminants are detected on the exposed surface, the resonant frequency changes from the resonant (natural) frequency of the sensor assembly to a resonant (natural) frequency of both the sensor assembly and the contaminants disposed on the exposed surface. A change in the natural frequency $\Delta\omega_n$ due to the contaminants disposed on the exposed surface can be represented mathematically by Equation (2):

$$\Delta\omega_{n\_norm} = 1 - \sqrt{\frac{1}{1 + \Delta m_{norm}}} \tag{2}$$

where $\Delta\omega_{n\_norm} = \dfrac{\Delta\omega_n}{\omega_n}$ is a normalized change in natural frequency and $$\Delta m_{norm} = \frac{\Delta m}{m}$$

is a normalized change in mass both of which are unitless.

Figure 3:
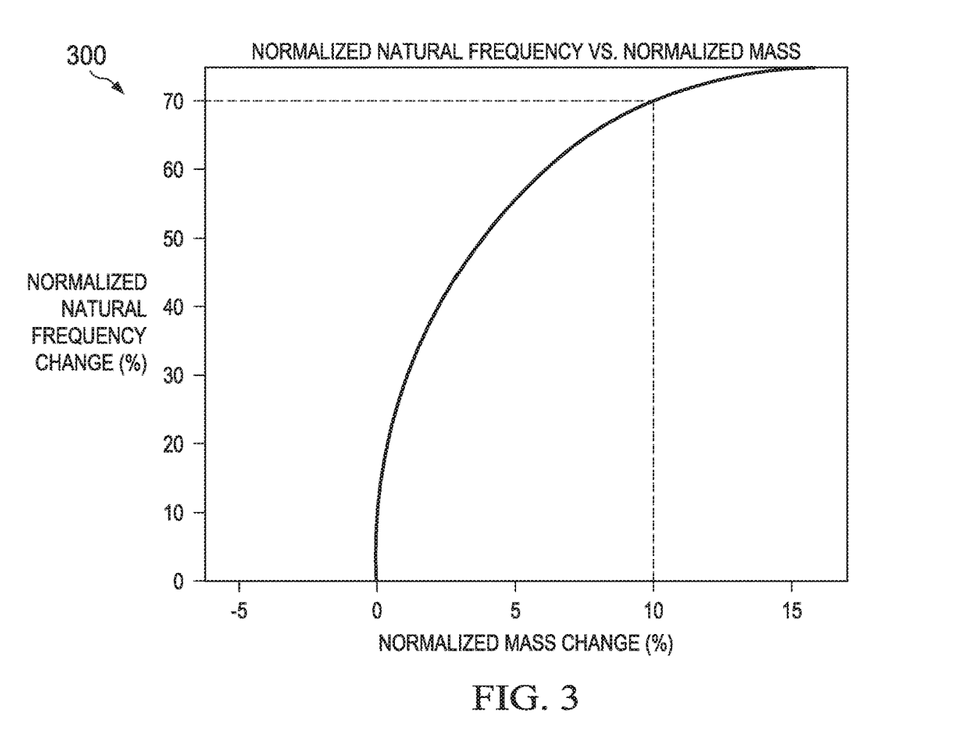
FIG. 3 illustrates an example plot illustrating a normalized natural frequency vs. normalized mass.

FIG. 3 is an example plot 300 that illustrates a change in the normalized natural frequency vs. a change in the normalized mass, as described above. The change in normalized natural frequency is very sensitive to a small change in normalized mass. In the example in FIG. 3, a change in normalized mass of about 10% results in a change in normalized natural frequency of about 70%. Thus, the sensitivity of the change in the resonant or natural frequency is effective in detecting the presence of contaminants on the exposed surface. Detection of the contaminants can be detected at a first resonant frequency, a second resonant frequency, etc.

Figure 4:
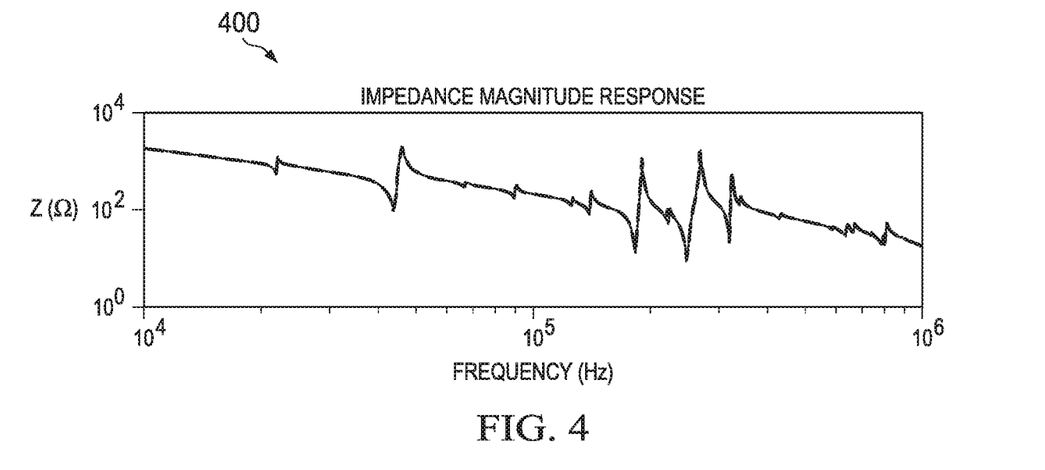
FIG. 4 is an example impedance magnitude response curve for an example actuator.
Figure 5:
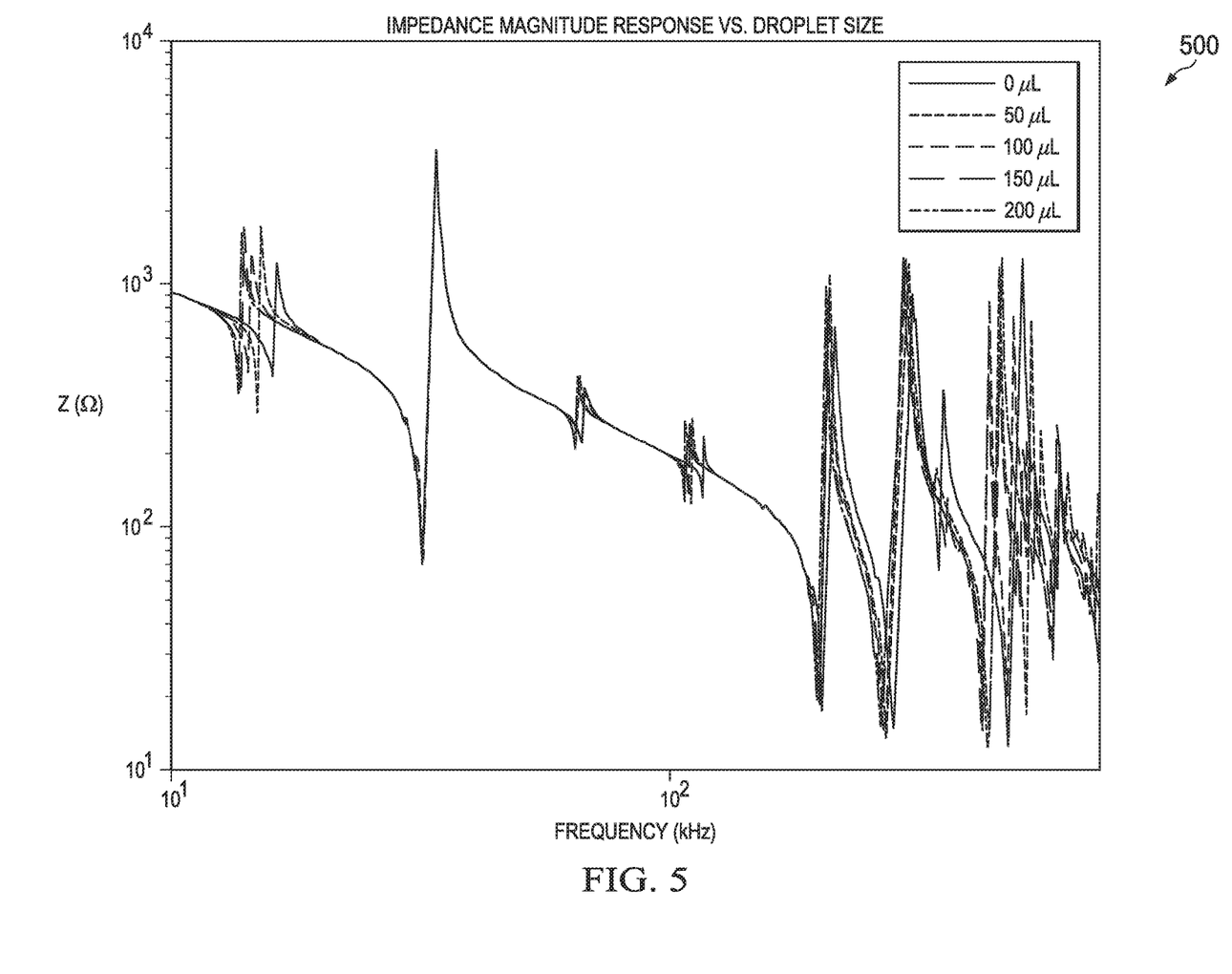
FIG. 5 illustrates example impedance magnitude response curves as a function of frequency for an example sensor assembly including different water droplet volumes disposed on the exposed surface of the example sensor assembly.

Still referring to FIG. 1, the frequency response measurement circuit 116 measures a frequency response of the sensor assembly or any part thereof at a given resonant frequency to identify the type of contaminant and the amount of contaminant on the exposed surface. The frequency response of the sensor assembly plus the contaminants correlates to a specific amount of mass for contaminants on the exposed surface. For example, FIG. 4 is an example frequency response, which shows the impedance magnitude response curve 400 for an example sensor assembly. The peak is a pole of the impedance magnitude response and the valley is a zero of the impedance magnitude response. The pole-zero pair represent a resonant frequency of the example sensor assembly. More specifically, the pole represents a parallel resonant frequency and the zero a series resonant frequency. The term parallel resonant frequency refers to a resonance between the parallel combination of the mechanical subsystem and the dielectric whereas the term series resonance frequency refers purely to a resonance of the mechanical subsystem. FIG. 5 illustrates example impedance magnitude response curves 500 as a function of frequency for the example sensor assembly of FIG. 4 for different water droplet volumes ranging from 0 μL to 200 μL disposed in the center of the exposed surface of the example sensor assembly.

As illustrated in FIG. 5, a given resonant frequency will shift by different amounts based on the amount of water (or other contaminants) disposed on the exposed surface. The amount of frequency shift from the resonant frequency of the sensor assembly correlates to an amount of mass on the exposed surface. Thus, in order to identify the type and amount of the contaminant on the exposed surface, the contaminant detection sub-system 110 can be calibrated with the resonant frequencies and frequency responses of the sensor assembly and any and all likely contaminant mass levels that may come in contact with the exposed surface. This information can be stored in a database 180 and the comparator 118 compares the measured resonant frequencies and frequency responses with the stored resonant frequencies and frequency responses to determine the amount and/or type of contaminants on the exposed surface of the sensor assembly. Identification of the contaminants can be initialized at a first resonant frequency, a second resonant frequency, etc.

Figure 6:
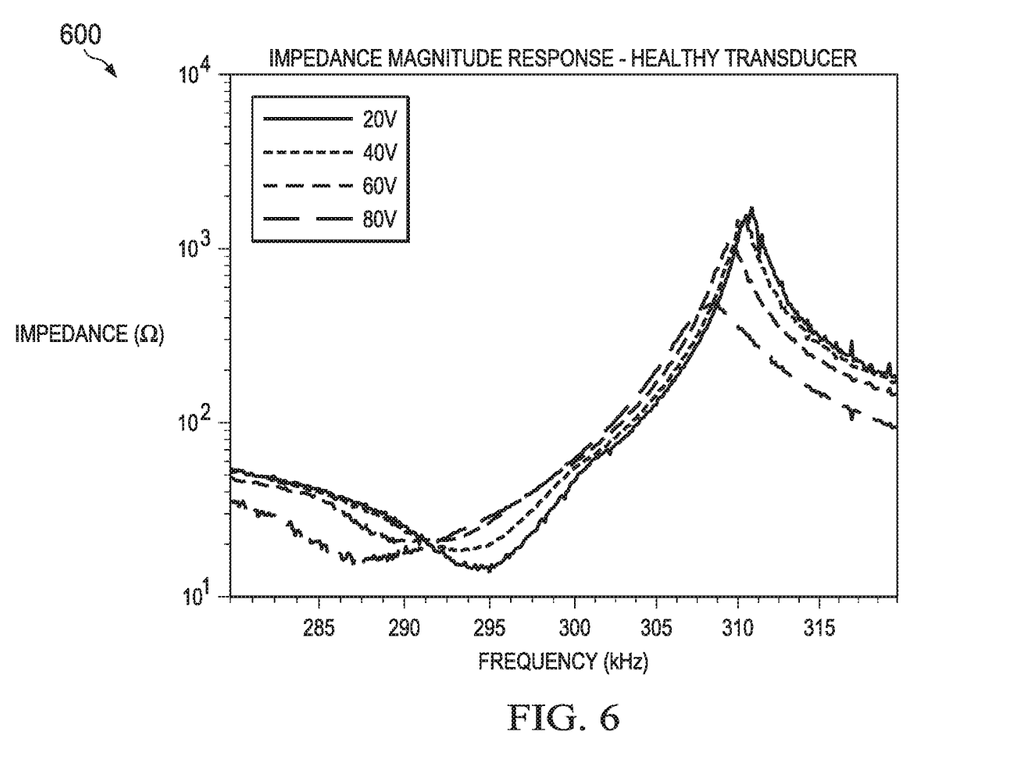
FIG. 6 illustrates an impedance magnitude response curve for an example non-faulty actuator and corresponding sensor assembly for different voltage excitation levels at around 300 kHz.
Figure 7:
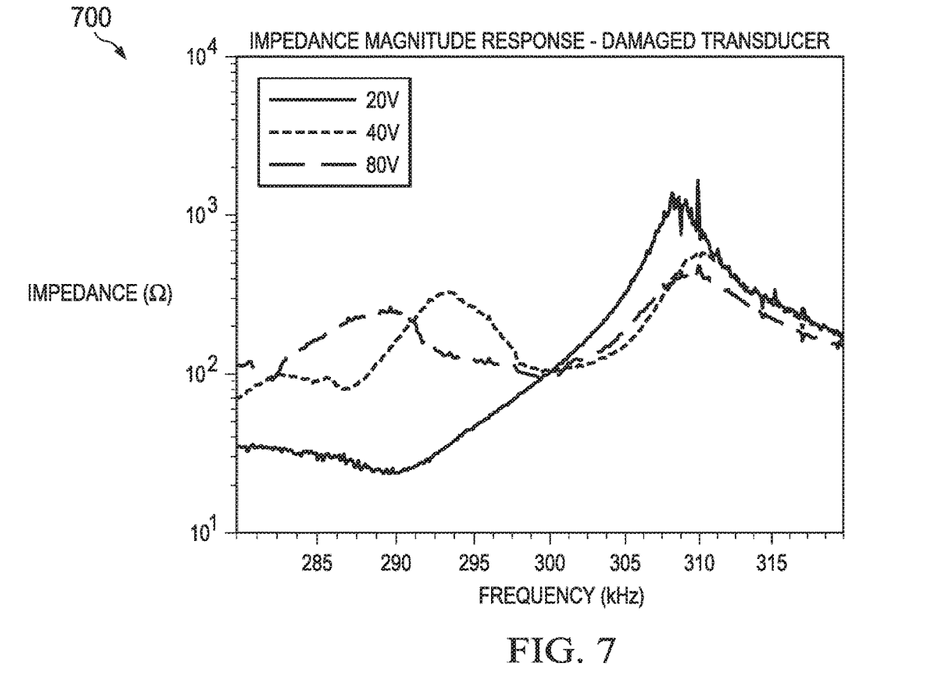
FIG. 7 illustrates an impedance magnitude response curve for an example faulty actuator and corresponding sensor assembly for different voltage excitation levels at around 300 kHz.

Still referring to FIG. 1 and to FIGS. 6 and 7, the fault detection sub-system 130 performs system checks when the cleaning system 140 has not detected any appreciable mass on the exposed surface. System checks are performed by comparing a frequency response for a non-faulty, functional actuator and corresponding sensor assembly to a frequency response for a faulty, non-functional actuator and corresponding sensor assembly. For example, FIG. 6 shows the impedance magnitude response for an example non-faulty, functioning (healthy) actuator and corresponding sensor assembly for different voltage excitation levels at around 300 kHz. The response has a zero between 285 and 295 kHz and a pole between 305 and 310 kHz, depending on the voltage excitation level. FIG. 7, on the other hand, shows the impedance magnitude response for an example faulty or damaged actuator and corresponding sensor assembly for different voltage excitation levels at around 300 kHz. In this case, the zero near 290 kHz no longer has a resonant effect when the voltage level increases to the required level to excite the actuator. As a result, the impedance magnitude response of the sensor assembly can be monitored periodically during the life of the actuator. If the response indicates that the resonant frequency is no longer present, then the actuator is faulty and the fault detection sub-system 130 disables a system start signal (explained further below).

One example of a faulty actuator that the fault detection sub-system 130 can detect by a frequency response is the de-polarization of the piezoelectric material in a piezoelectric transducer when the transducer overheats. This failure occurs when the temperature of the material exceeds its Curie temperature and occurs when too much current is driven thru the sensor assembly during the cleaning process. Other example failures may include a cracked or broken lens, transducer cracking, seal failure, epoxy failure, etc. Thus, as explained in the previous paragraph, the frequency response for the faulty actuator can be compared to the frequency response when the actuator is not faulty. The frequency response(s) for non-faulty actuators can be stored in a database 180 and accessed to compare the faulty actuator frequency responses to the non-faulty actuator frequency responses.

Referring back to FIG. 1, the cleaning sub-system 140 initiates a cleaning process based on the identification of the contaminants by the contaminant detection sub-system 110. The cleaning sub-system 140 includes a cleaning mode selector 142, a cleaning phase selector 144, and a signal generation device 146. The cleaning mode selector 142 includes multiple cleaning modes (1, 2 . . . N) and selects a cleaning mode based on the type of contaminant disposed on the exposed surface as determined by the contaminant detection sub-system 110 described above. For example, a first cleaning mode may be implemented in response to determining the type of contaminants that correspond to mist, a second cleaning mode may be implemented in response to determining the type of contaminants that correspond to water droplets, a third cleaning mode may be implemented in response to determining the type of contaminants that correspond to ice, etc. Additional cleaning modes may correspond to other types of known (or unknown) types of contaminants such as dirt, mud, leaves, etc.

The cleaning phase selector 144 selects a cleaning phase from multiple cleaning phases (A, B . . . N) within a given cleaning mode based on the amount (e.g., size, mass, weight, volume, etc.) of contaminant disposed on the exposed surface as determined by the contaminant detection sub-system 110 described above. Thus, each cleaning mode can include one or more different cleaning phases depending on the amount of contaminants. Each cleaning phase within a given cleaning mode can provide a different level, intensity or process of cleaning based on the amount of contaminants on the exposed surface. Specifically, each cleaning phase can include one or more different parameters (i, ii . . . n) that define the cleaning process. The cleaning parameters can be defined as a frequency and/or voltage level that excites the actuator at specific resonant frequencies and/or amplitudes, which in turn vibrates the exposed surface thereby expelling contaminants from the exposed surface. Other parameters can include a time period (duration), heat drying, etc. Cleaning the exposed surface with ultrasonic systems and methods is disclosed in co-pending U.S. patent application Ser. No. 15/492,286, filed Apr. 20, 2017, entitled METHODS AND APPARATUS USING MULTISTAGE ULTRASONIC LENS CLEANING FOR IMPROVED WATER REMOVAL, and is herein incorporated by reference in its entirety.

As mentioned above, each cleaning phase can provide a different process of cleaning. For example, larger amounts of contaminants disposed on the exposed surface require a more aggressive cleaning than smaller amounts. For example, if the cleaning mode selector 142 selects a cleaning mode that corresponds to water, the phase selector 144 selects the cleaning phase that includes an appropriate number of cleaning parameters to efficiently expel the water from the exposed surface. More specifically, a first parameter can correspond to a first (high) frequency (e.g., about 300 kHz) that vibrates the actuator and hence, the exposed surface to atomize large water droplets. A second parameter can correspond to a second (lower) frequency (e.g., about 25 kHz) that vibrates the actuator to further expel smaller water droplets. A third parameter can correspond to using the transducer as a heating device to heat dry the remaining water droplets. Thus, during the cleaning process, as the amount of the contaminant on the exposed surface changes (decreases/increases), the cleaning phase and/or the cleaning parameter can change accordingly, (e.g., from a more aggressive cleaning process to a lesser aggressive cleaning process (or vice versa)) to efficiently remove the contaminant from the exposed surface. In other words, the voltage and/or frequency or any other parameter can vary during the cleaning process.

The signal generation device 146 generates a cleaning control signal 148 to an actuator via an actuator interface 150. The cleaning control signal 148 drives the actuator or other cleaning parameter based on the selected cleaning phase and/or cleaning parameters. The cleaning signal may have a predetermined frequency and/or voltage level that drives the actuator at the resonant frequency and/or amplitude to efficiently expel or dissipate the contaminants from the exposed surface. The cleaning signal can dynamically change as the cleaning mode, the cleaning phase, and/or the cleaning parameters dynamically change. As the contaminants begin to dissipate from the exposed surface, the resonant frequency of the exposed surface including the remaining contaminants changes. Thus during dissipation, the resonant frequency is essentially constantly changing. Therefore, as the resonant frequency changes, the cleaning mode, the cleaning phase and/or the cleaning parameters can change to continue efficient dissipation of the contaminants from the exposed surface that corresponds to the changing resonant frequency. In addition, the cleaning signal can be initiated at a first resonant frequency, a second resonant frequency, etc.

Figure 8:
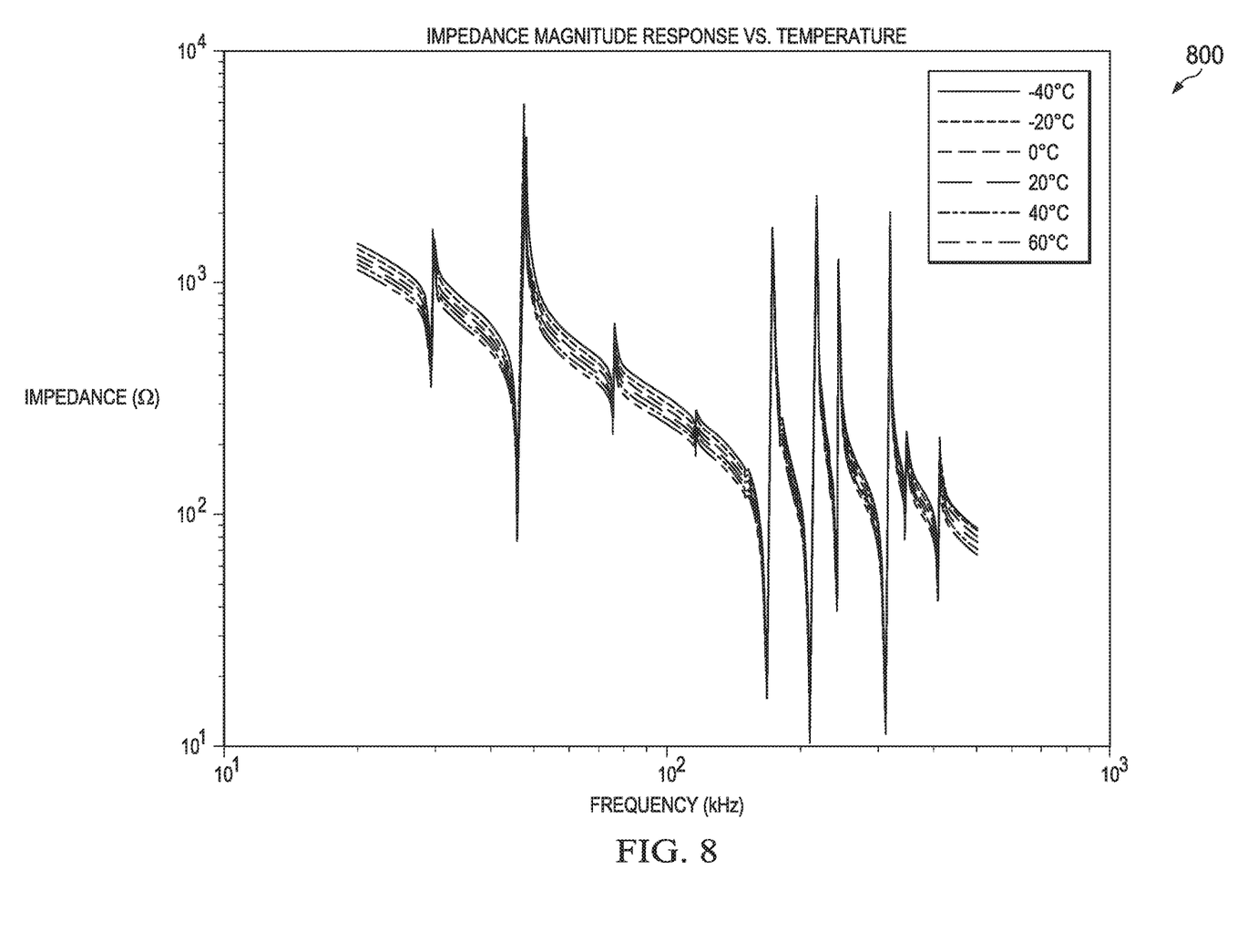
FIG. 8 illustrates an example impedance magnitude response curve for an example piezoelectric transducer and housing cover used in a sensor assembly for different temperatures.
Figure 9:
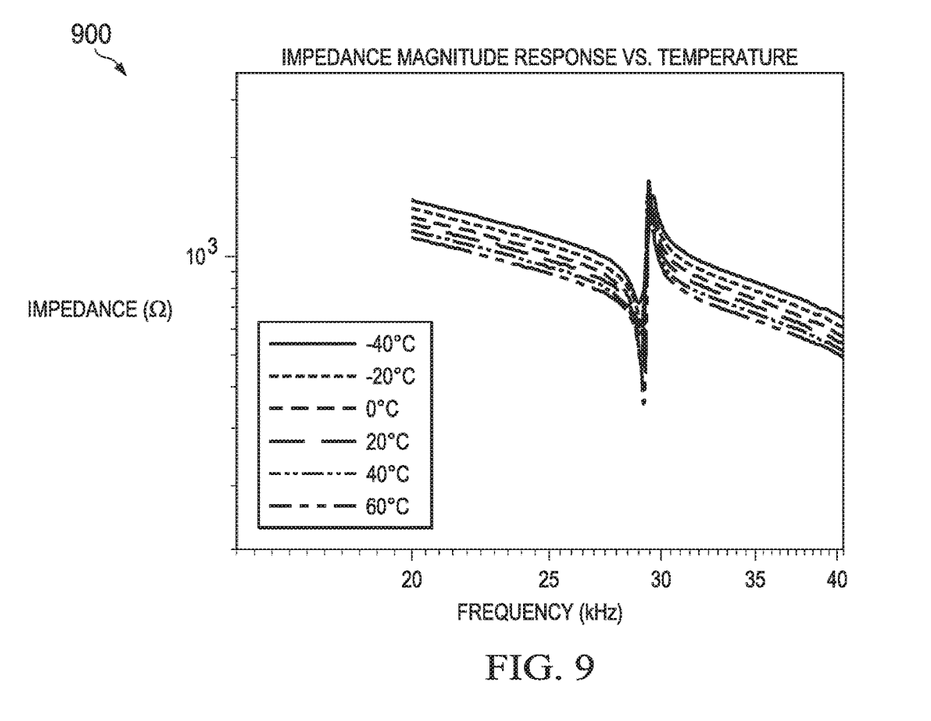
FIG. 9 illustrates example impedance magnitude response curves for a frequency range of 20 to 40 kHz.
Figure 10:
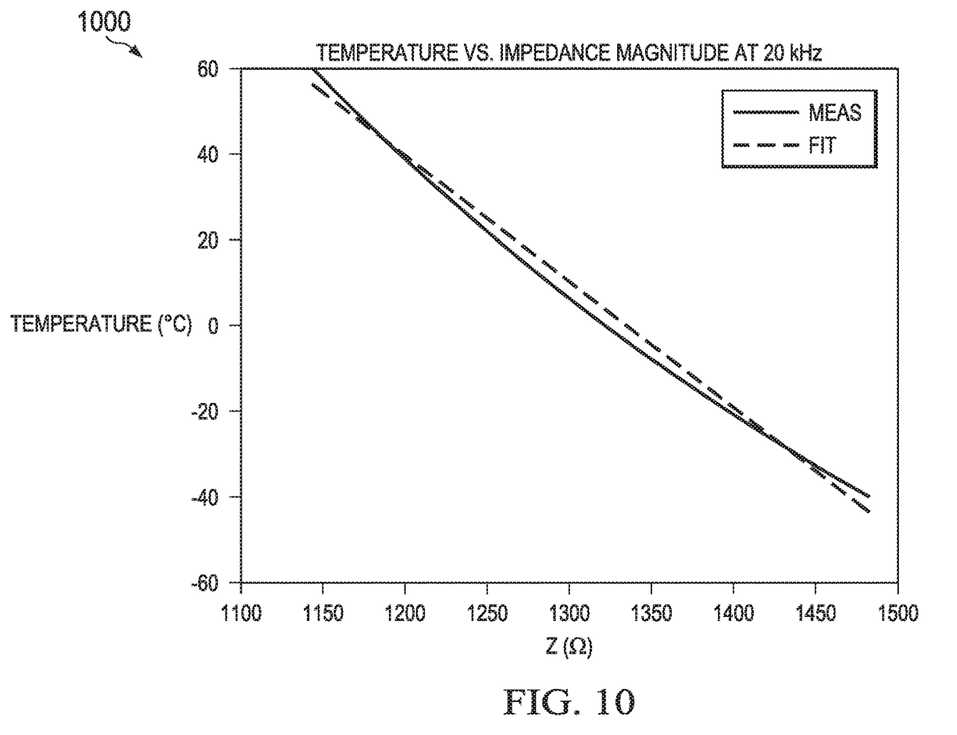
FIG. 10 illustrates an example plot that compares a temperature estimate using a linear equation for an example actuator and actual temperature from the impedance magnitude response plots of FIG. 9.

Referring back to FIG. 1 and to FIGS. 8-10, the temperature monitoring device 160 monitors a temperature of the actuator and can also serve as a power regulation device to regulate power to the actuator. Since the actuator is connected (e.g., mechanically coupled) to the exposed surface, the temperature monitoring device consequently monitors a temperature of the exposed surface. If the temperature of the actuator and/or exposed surface exceeds a threshold temperature the cleaning process is stopped until the actuator and/or exposed surface cools to ambient temperature or below the threshold temperature. Cooling can be passive cooling (e.g., air cool) or active cooling (e.g., air jets, water spray, etc.). In some examples, the temperature can be monitored by an external device, such as a thermocouple, infrared sensor, etc.

In another example, the temperature can be monitored internally by the sensor assembly. For example, the temperature monitoring device 160 can determine the temperature of the actuator and/or sensor assembly by measuring a frequency response of the sensor assembly for different temperatures. FIG. 8 illustrates an example impedance magnitude response 800 for an example sensor assembly at different temperatures. The magnitude of the impedance response at a particular frequency (e.g. 20 kHz) can be used to determine the temperature of the transducer. This information can be stored and can be accessed to determine the temperature of the actuator and if the temperature of the transducer exceeds a temperature safety threshold. If so, the cleaning process is stopped until the actuator and/or exposed surface cools to a safe operating temperature, which is below the threshold temperature.

FIG. 9 shows a close-up view of the impedance magnitude response 900 from 20 to 40 kHz. Given that the change in the impedance magnitude is uniform for a constant step changes in frequency, the temperature can easily be determined from the impedance data. In this example, the linear equation describing the temperature as a function of impedance magnitude for this example transducer is given by equation (3):

$$T=-0.29*Z+392.6 \qquad (3)$$

that has a coefficient of determination value of $R^2=0.9932$. As this value approaches unity, the variance between the estimated value using the linear equation and the actual value is minimized.

FIG. 10 shows a plot 1000 that compares the temperate estimate using the linear equation and the actual temperature from the impedance magnitude plots. The maximum error in the estimated temperate is approximately 3.7° C. Thus, once an impedance magnitude value is known, the temperature of the actuator can be accurately estimated using a simple linear equation.

Referring back to FIG. 1, the controller 170 includes a microprocessor (microcontroller) 172 for executing instructions and/or algorithms to carry out the process of the sensing and signaling control/monitoring system 100. The microprocessor 172 can be embedded in a smart amplifier in a way such that the control system can be integrated into a single chip or can be comprised of multiple chips that are connected via bond wires. Logic control for the controller 170 can be software based (instructions executable by a processor core) or implemented as hardware, such as an arrangement of logic gates.

The controller 170 may further include a data storage device 174 that may store data and/or instructions such as executable program code that is executed by the microprocessor 172. The data storage device 174 may store a number of applications and data that the microprocessor 172 can execute to implement at least the functionality described herein. The data storage device 174 may comprise various types of memory modules, including volatile and nonvolatile memory. For example, the data storage device 174 can include one or more of random-access memory (RAM) 176, read-only memory (ROM) 178, flash solid state drive (SSD) (not shown), and a database 180. Additional devices and/or circuits 182, such as but not limited to pulse-width (PWM) switching controller(s), PWM pre-driver(s), amplifier(s), analog-to-digital convertor(s), multiplexor(s), etc. that facilitate execution of the signals regarding the actuator may be included.

Figure 11:
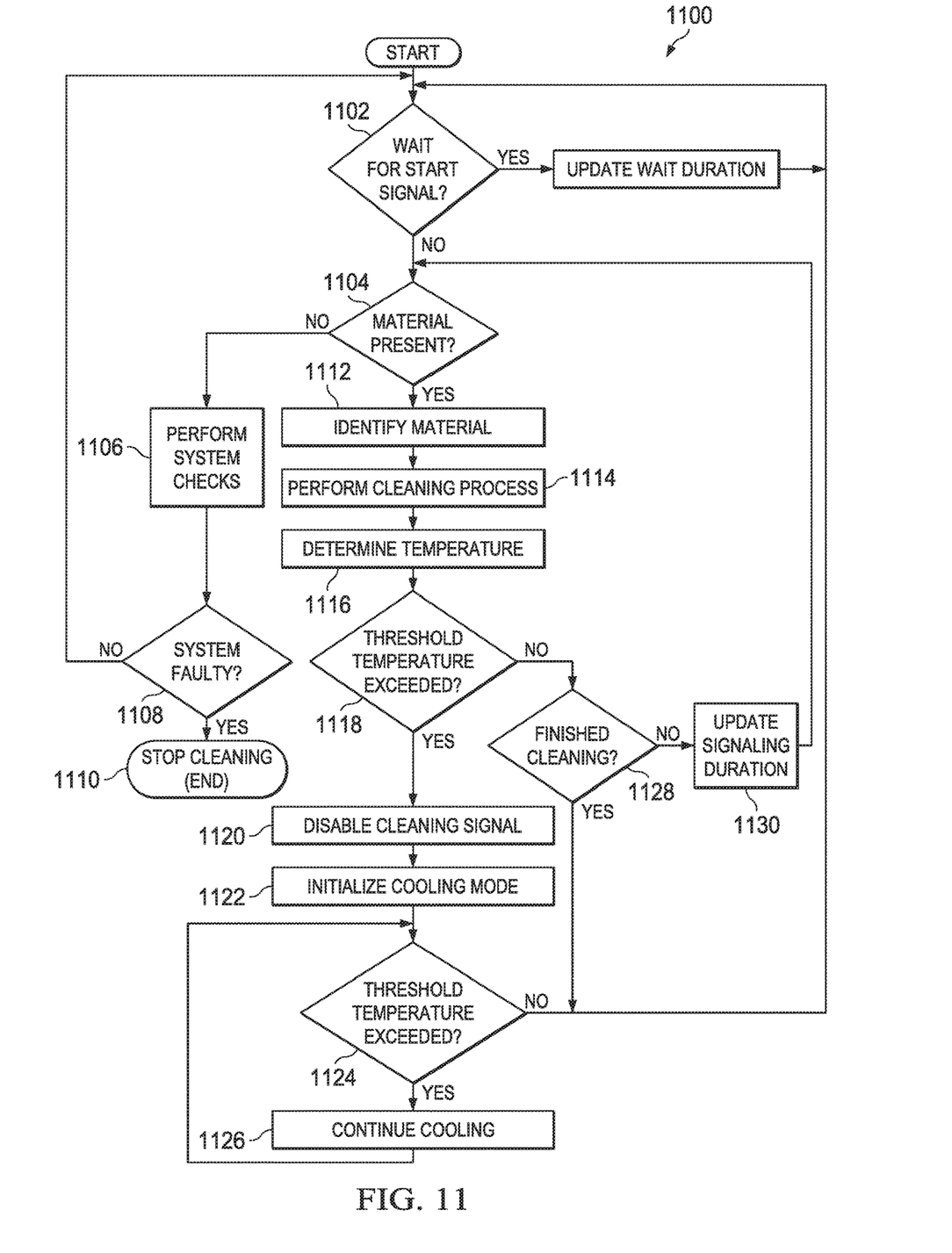
FIG. 11 is flow diagram illustrating an example method of expelling foreign contaminants from an exposed surface.

FIG. 11 is flow diagram 1100 illustrating an example method of expelling the foreign contaminants from the exposed surface of the sensor assembly. The process begins in the contaminant sub-system described above. At 1102, the sensing and signaling control/monitoring system waits a period of time (e.g., waits for the system start signal) before beginning the process. At 1104, after the wait period has expired, the frequency measurement device monitors the resonant frequency to determine if contaminant(s) are present on the exposed surface. If no material is detected, then at 1106, the process proceeds to the fault detection sub-system where the sensing and signaling control/monitoring system undergoes a system check. At 1108, a decision is made to determine if the sensor assembly or any other component is faulty. If the system is faulty, then at 1110, the cleaning process stops. If the system is not faulty, the process loops back to 1102 and the process starts again.

If at 1104 material is detected, the contaminant detection sub-system 110 generates a material detection signal, then at 1112 the frequency response measurement circuit identifies the type of contaminant disposed on the exposed surface. At 1114, the process proceeds to the cleaning sub-system and the cleaning process is performed, which is further described below with reference to FIG. 12. At 1116, the temperature of the actuator is measured. At 1118, a decision is made to determine if the temperature of the actuator exceeds a temperature threshold. If "YES," the process proceeds to the temperature monitoring sub-system where at 1120, the cleaning process is disabled. At 1122, cooling of the actuator and/or exposed surface is initialized. At 1124, a decision is made to determine if the actuator temperature still exceeds the temperature threshold. If "YES," then at 1126 the cooling continues and the process loops back to 1124. If "NO," then the process starts again at 1102.

If at 1118 the actuator temperature does not exceed the temperature threshold, then at 1128, a decision is made to determine if the cleaning process is complete. If "YES," then the process starts again at 1102. If "NO," then at 1130 the cleaning signal duration is updated and the process loops back to 1104.

Figure 12:
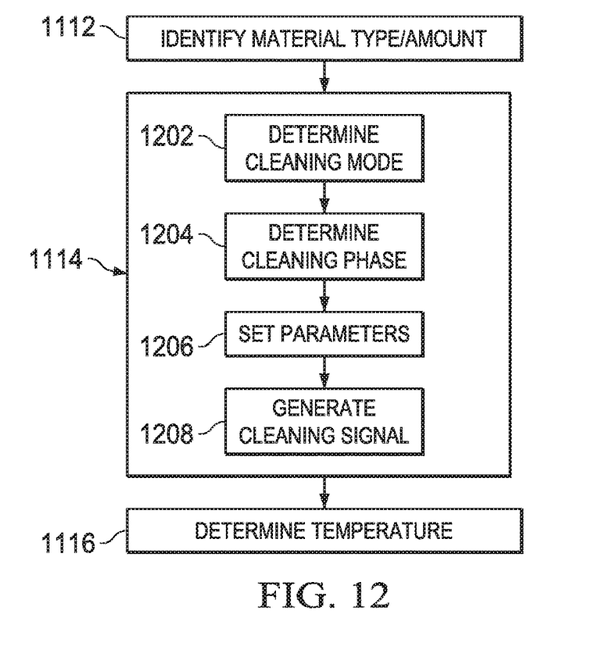
FIG. 12 is flow diagram illustrating an example cleaning process.

FIG. 12 is flow diagram illustrating an example cleaning process represented as 1114 in FIG. 11. At 1202, the cleaning mode is determined based on the type of contaminant disposed on the exposed surface, as described above. At 1204, the cleaning phase is determined based on an amount of contaminants disposed on the exposed surface. At 1206, the cleaning parameters are set based on the phase selection. At 1208, the cleaning signal is generated to thereby initialize the cleaning process.

Figure 13:
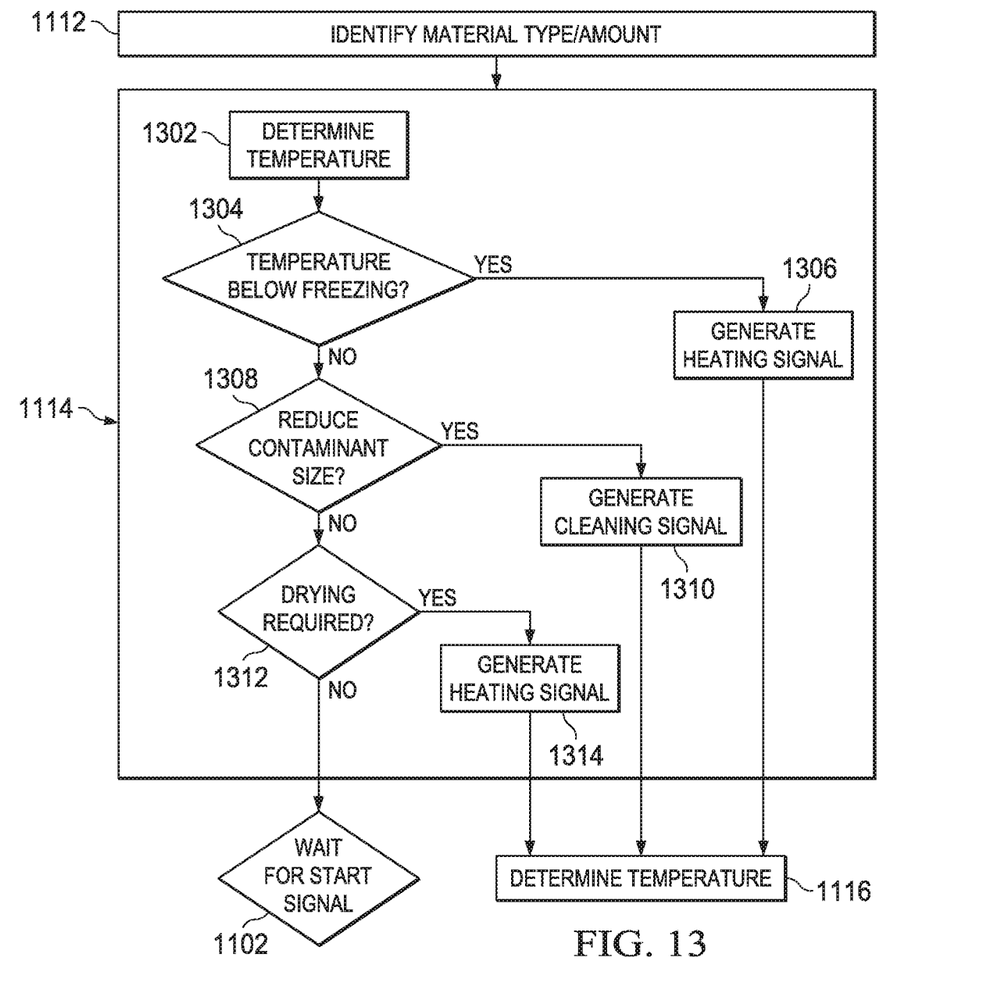
FIG. 13 is a flow diagram illustrating another example cleaning process.

FIG. 13 is a flow diagram illustrating another example cleaning process represented as 1114 in FIG. 11. Prior to this process, it was determined that the contaminant identified on the exposed surface is ice and/or water. At 1302, the temperature of the actuator is determined, which in turn determines the temperature of the exposed surface. At 1304, a decision is made to determine if the temperature is below freezing, which is an indication that ice has formed on the exposed surface. If "YES," then a heating signal is generated to heat the exposed surface to thereby melt the ice. If "NO," then at 1308 a decision is made to determine if the amount of contaminant should be reduced. If "YES," then at 1310 a cleaning signal is generated to excite the actuator at a resonant frequency of the exposed surface plus any contaminants on the exposed surface. If "NO," then at 1312 a decision is made to determine if drying is required based on the amount of contaminant. If "YES," then at 1314 a heat signal is generated thereby heating the exposed surface of the sensor assembly. If "NO," then the process loops back to 1102 and starts the process over again.

What have been described above are examples of the disclosure. It is, of course, not possible to describe every conceivable combination of components or methods for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A system, comprising:
a sensor assembly including a housing, an actuator in the housing, and a housing cover, the actuator having an actuator input and configured to expel contaminants from the housing cover responsive to a cleaning control signal at the actuator input;
a contaminant detection subsystem having a detection output, the contaminant detection subsystem coupled to the sensor assembly, and the contaminant detection subsystem configured to: measure a resonant frequency of the sensor assembly; responsive to the resonant frequency, detect the contaminants and responsive to detecting the contaminants, provide a detection signal at the detection output; and
a cleaning subsystem having a subsystem input and a subsystem output, the subsystem input coupled to the detection output, the subsystem output coupled to the actuator input, and the cleaning subsystem configured to provide the cleaning control signal at the subsystem output responsive to the detection signal.

2. The system of claim 1, wherein the contaminant detection subsystem includes a frequency measurement circuit configured to determine a presence or an absence of the contaminants on the housing cover, including by measuring a change in the resonant frequency.

3. The system of claim 2, wherein the cleaning subsystem includes a cleaning mode selector configured to select a cleaning mode from a plurality of cleaning modes, based on the change in the resonant frequency.

4. The system of claim 3, wherein the cleaning subsystem includes a cleaning phase selector configured to select a cleaning phase from a plurality of cleaning phases, based on the change in the resonant frequency.

5. The system of claim 1, wherein the contaminant detection subsystem includes a frequency response measurement circuit configured to determine a type of the contaminants or an amount of the contaminants, including by measuring a change in a frequency response of the sensor assembly.

6. The system of claim 5, wherein the cleaning subsystem is configured to provide the cleaning control signal at the subsystem output responsive to at least one of the type of the contaminants or the amount of the contaminants.

7. The system of claim 6, wherein the actuator is configured to adjust an amplitude of a vibration of the housing cover and to adjust a frequency of the vibration, responsive to the cleaning control signal.

8. The system of claim 7, wherein the frequency response measurement circuit is configured to determine the type of the contaminants or the amount of the contaminants at a first resonant frequency of the sensor assembly, and the cleaning subsystem is configured to provide the cleaning control signal at a second resonant frequency of the sensor assembly.

9. The system of claim 5, further comprising a fault detection device configured to detect a fault in the sensor assembly based on the change in the frequency response of the sensor assembly at different voltage excitation levels, including by determining whether the resonant frequency of the sensor assembly is present at the different voltage excitation levels, and to disable the cleaning control signal responsive to the detected fault.

10. The system of claim 5, further comprising a temperature regulating device coupled to the actuator, the temperature regulating device configured to determine whether a temperature of the actuator exceeds a temperature threshold based on the change in the frequency response of the sensor assembly, and to disable the cleaning control signal and initiate a cooling procedure to cool the actuator responsive to the temperature of the actuator exceeding the temperature threshold.

11. The system of claim 1, further comprising a temperature regulating device configured to regulate a temperature of the contaminant detection subsystem or of the sensor assembly, wherein the contaminant detection subsystem is configured to adjust the cleaning control signal responsive to the temperature of the contaminant detection subsystem and the resonant frequency of the sensor assembly, and the actuator is configured to adjust an amplitude of a vibration of the housing cover and to adjust a frequency of the vibration responsive to the cleaning control signal.

12. A system, comprising:
a sensor assembly including: a housing; and an actuator in the housing, the actuator having an actuator input and configured to expel contaminants from the housing responsive to a cleaning control signal at the actuator input;
a contaminant detection subsystem having a detection output, the contaminant detection subsystem coupled to the sensor assembly, and the contaminant detection subsystem configured to: measure a resonant frequency of the sensor assembly; responsive to the resonant frequency, detect the contaminants; and responsive to detecting the contaminants, provide a detection signal at the detection output;
a cleaning subsystem having a subsystem input and a subsystem output, the subsystem input coupled to the detection output, the subsystem output coupled to the actuator input, and the cleaning subsystem configured to provide the cleaning control signal at the subsystem output responsive to the detection signal; and
a temperature regulating device coupled to the actuator, the temperature regulating device configured to: monitor a temperature of the actuator; and regulate power to the actuator based on the temperature.

13. The system of claim 12 further comprising a fault detection device configured to detect a fault in the sensor assembly based on a change in a frequency response of the sensor assembly at different voltage excitation levels, including by determining whether the resonant frequency of the sensor assembly is present at the different voltage excitation levels, and to disable the cleaning control signal responsive to the detected fault.

14. The system of claim 12, wherein the contaminant detection subsystem includes a frequency measurement circuit configured to determine a presence or an absence of the contaminants on the housing, including by measuring a change in the resonant frequency.

15. The system of claim 12, wherein the contaminant detection subsystem includes a frequency response measurement circuit configured to determine a type of the contaminants or an amount of the contaminants, including by measuring a change in a frequency response of the sensor assembly.

16. The system of claim 12, wherein the temperature regulating device is configured to determine whether the temperature of the actuator exceeds a temperature threshold based on a change in a frequency response of the sensor assembly, and to disable the cleaning control signal and initiate a cooling procedure to cool the actuator responsive to the temperature of the actuator exceeding the temperature threshold.

* * * * *